United States Patent [19]
Gunton

[11] Patent Number: 5,535,445
[45] Date of Patent: Jul. 9, 1996

[54] MIXER CIRCUIT

[75] Inventor: David J. Gunton, Stakeford, England

[73] Assignee: The Secretary of State for Defence in Her Britannic Majesty's Government of the United Kingdom of Great Britain and Northern Ireland, London, England

[21] Appl. No.: 623,162

[22] Filed: May 8, 1984

[30] Foreign Application Priority Data

May 9, 1983 [GB] United Kingdom ............... 8312704

[51] Int. Cl.⁶ ............................................. H04B 1/26
[52] U.S. Cl. ............................................. 455/327
[58] Field of Search ................ 333/247; 343/700 MS; 455/269, 280, 282, 293, 327, 334

*Primary Examiner*—Theodore M. Blum
*Attorney, Agent, or Firm*—Cushman Darby & Cushman

[57] ABSTRACT

A mixer circuit (1), comprised of two planar dipoles (3, 5), mounted upon a dielectric insulator or semiconductor body. Mixer elements (M1, M2) are incorporated in the path of each dipole (3, 5), there being two such elements each fed by both dipoles. The first of these dipoles, dipole (5) is split along part of its length, this split section (23) serving as a delay-line between one of the mixer elements, element (M1), and the second dipole (3). The second dipole (3) is split along at least a part of its length and is open at one end. A connective link (29C) is provided between one of the delay-line conductors (25/11) and one of the split parts (9) of the second dipole (3). Intermodulation signal developed in the one mixer (M1;M2) can then be extracted from the split ends (9, 13; 7, 11) of the second dipole (3). The link (29C) is formed outside the envelope of the delay-line (23) and does not affect its broad band properties. A slowing mechanism—for example, combine interdigitated structure (31) can be included in the delay-line (23). Preferably the link (23C) runs parallel to a significant portion of the length of the second dipole (3), the latter thus modified forming a folded dipole.

7 Claims, 5 Drawing Sheets

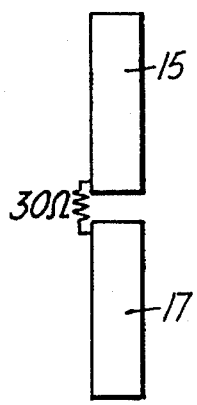
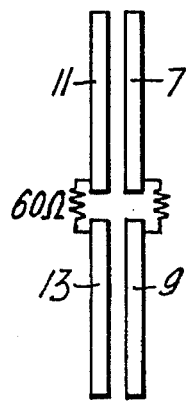
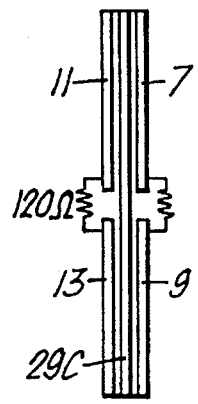
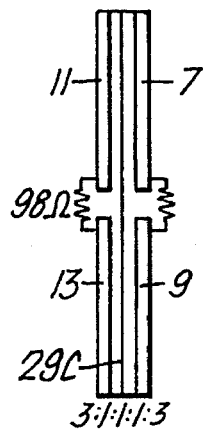
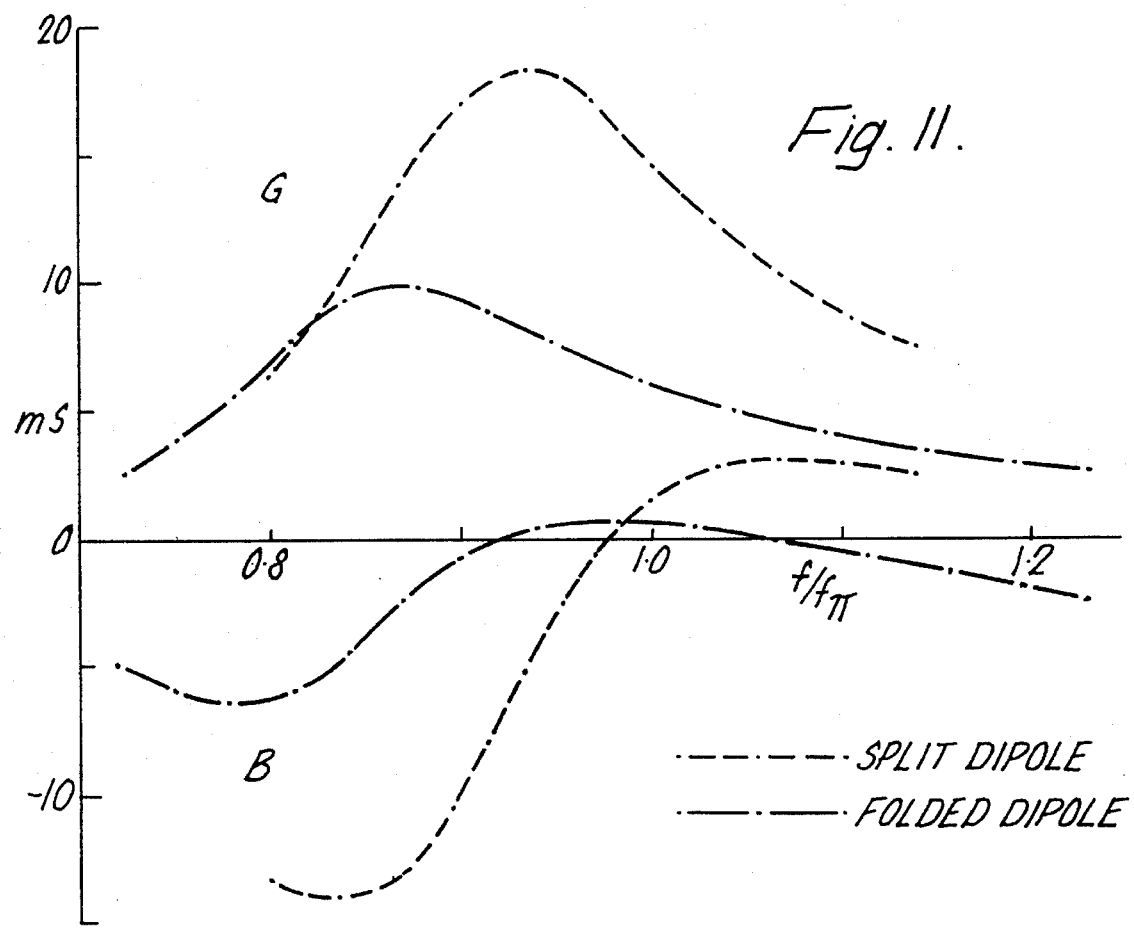

MIXER CIRCUIT

TECHNICAL FIELD

The invention concerns improvements in mixer circuits, especially circuits responsive to radiation having a frequency in the range 25 to 500 GHz.

Such circuits typically incorporate a pair of matched mixer elements, a signal feed (@$\omega_s$), a reference feed (@$\omega$), and phase shifters between the feeds and the mixers. By this means a signal at the difference frequency ($\omega$-$\omega_s$) ie intermediate frequency (IF) may be extracted from each mixer. A particular example is a dual-balanced mixer circuit, where with appropriate values of phase shift and combination of the IF signals, it is possible to optimise signal to noise in the IF output and to reject noise at image frequency ie at frequency (2$\omega$-$\omega_s$). Such circuits have application to passive radio-metry and radar for surveillance, mapping, imaging and guidance.

BACKGROUND ART

In a typical application a micro-circuit mixer is connected via waveguide to an aerial collecting dish or antenna. The micro-circuit usually consists of a dielectric support plate having patterned conductors and bonded semiconductor mixer components — e.g., diodes — on one surface and may also be metallised over all or part of the other surface. The positioning of the above components is extremely critical. The micro-circuit is usually mounted in the waveguide cavity, or else is connected to the waveguide by a specially designed transition. The positioning of the circuit is also critical. Such assemblies are difficult to set up, fragile and expensive. Positioning of the components and of the circuit is difficult and costly.

DISCLOSURE OF THE INVENTION

This invention is intended to provide a mixer circuit of alternative construction, one which includes antennae as an integral part of the circuit and which in consequence obviates problems of waveguide positioning. Furthermore, the invention may be wholly embodied in monolithic integrated circuit form, and in such form it is mechanically rugged and extremely compact. It may, alternatively, be embodied as a hybrid circuit, for use in particular, at the low frequency end of the millimeter frequency range.

It is intended to provide a mixer circuit capable of relatively broad-band response.

In accordance with the invention there is provided a mixer circuit comprising:

a supportive substrate;

first and second dipoles, each of planar metal and lying upon the substrate, these dipoles intersecting and being arranged orthogonal to one another;

first and second mixer elements, each element being connected across a gap in the dipole metal of the first dipole and of the second dipole respectively, and each being fed by both dipoles;

the first dipole being split along a portion of its length and affording thereby a two conductor transmission delay line extending between the first mixer element and the region of dipole-dipole intersection;

the second dipole being split along a portion of its length and affording thereby a pair of isolated conductors extending between the region of dipole-dipole intersection and an open end of the second dipole; and a connective link joining one of the line conductors to one of the isolated conductors, this link lying outside of the envelope of the line but within the envelope of the second dipole, this link thus permitting the extraction of intermediate frequency signal (ie signal developed across the first mixer) via the two isolated conductors.

The substrate may be of dielectric insulator material and the mixer elements, as indeed also pre-amplifier transistors, may be bonded to the circuit (ie the mixer may be a hybrid circuit). Alternatively the substrate may be of semiconductor material having a thin insulator layer over its surface providing insulation between the substrate and overlaid dipole metal. In this latter case the circuit components may be formed in the body of the semiconductor substrate (ie the mixer may be a monolithic integrated circuit).

In the case of the hybrid circuit, the connective link may be provided by a short length of high inductance bond wire.

In preference to the foregoing, the connective link may be provided by a thin metal strip, a strip extending along a substantial part of the length of the second dipole, one or both ends of the second dipole being terminated each by a capacitor, the second dipole thus modified having the properties of a folded dipole. The advantage in this latter construction is that the relative dimensions of the folded dipole can be chosen so that the load impedance for both dipoles can be matched to result in more efficient performance.

Since the connective link lies outside of the envelope of the two-conductor delay line, the delay line properties are unaffected. This has the advantage that use can then be made of non-dispersive properties of the line and hence broadband operation can be achieved. A wide range of characteristic impedance values may be chosen by design. The delay line, being comprised of only two conductors, is relatively easy to fabricate. It is also possible to achieve extra phase delay in the delay line by means of a planar slowing mechanism — for example by using an interdigitated combine structure.

The advantages of the folded dipole configuration over simpler dipole configuration, are broader band operation because susceptance is low around center frequencies and impedance is straightforward to control by choice of the width of the center line of the folded dipole.

BRIEF INTRODUCTION OF THE DRAWINGS

In the drawings accompanying this specification:

FIGS. 7 to 10 are comparative plan drawings of dielectric backed dipoles with matched loads, namely a simple dipole, a split dipole, and two forms of folded dipole, respectively.

FIG. 11 is a graph showing the dependence of real and imaginary parts of the admittance upon frequency, calculated for the split dipole (FIG. 8), and, for one of the folded dipoles (FIG. 10);

Figure 12:
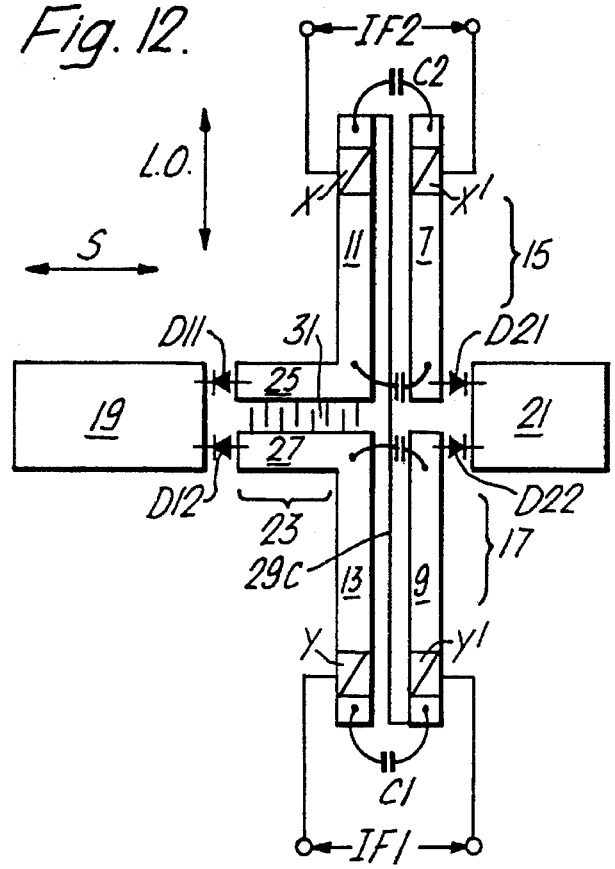
FIG. 12 is an illustrative plan drawing of a preferred construction of the dipoles circuit previously shown in FIG.
Figure 15:
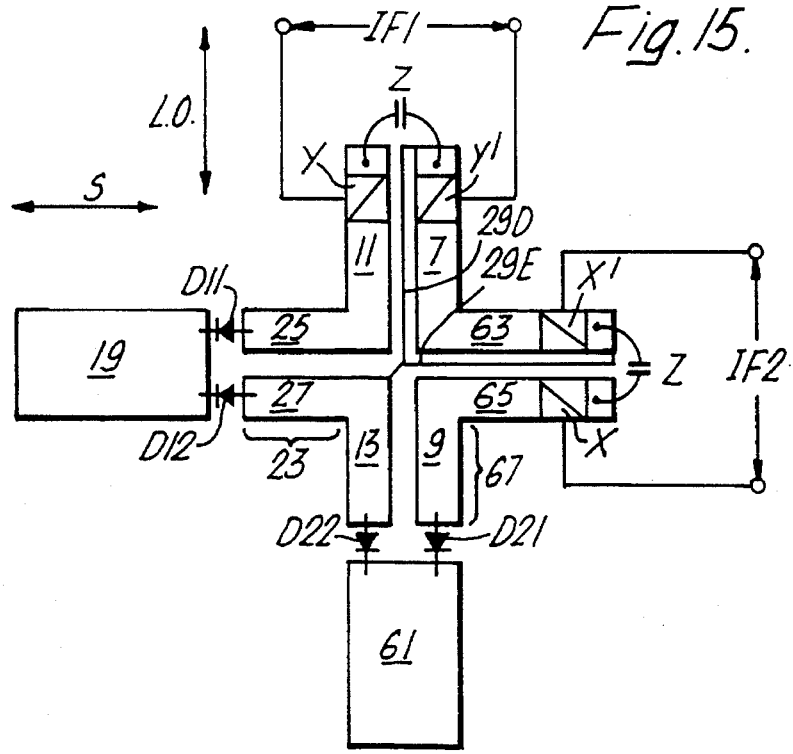
Figure 13:
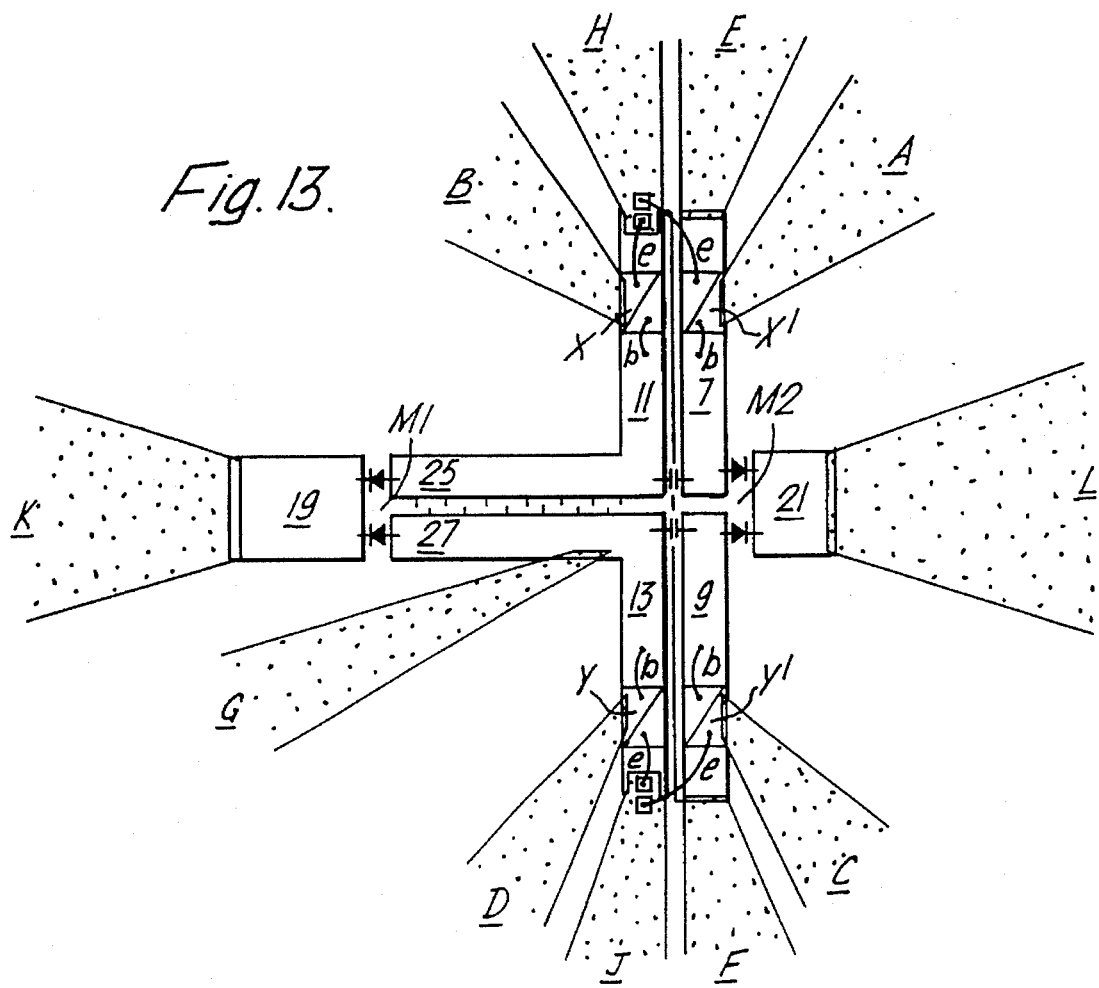
Figure 14:
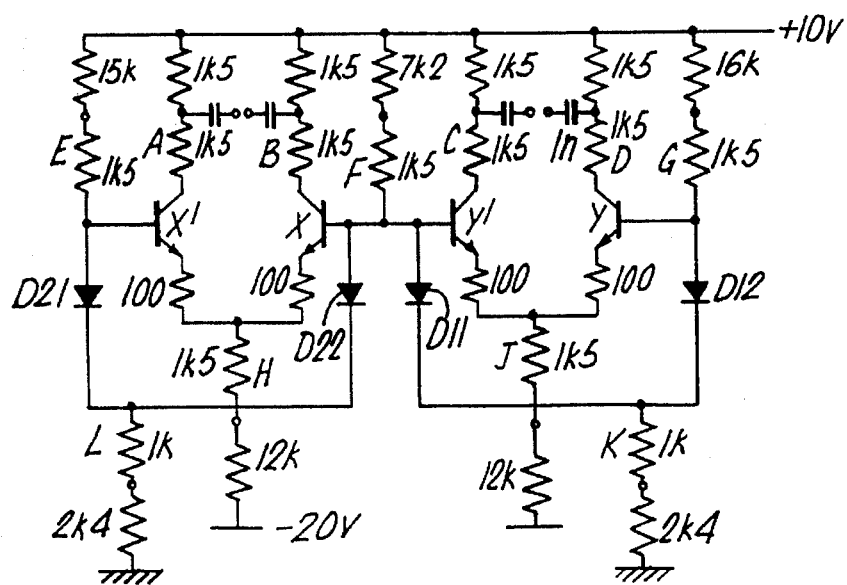

2 above, showing in particular the configuration of the link and an arrangement of capacitors required for optimised performance;

FIGS. 13 and 14 respectively, show in illustrative plan and in equivalent circuit form, a dc biassing arrangement for the dipole circuit of FIG. 12; and FIG. 15 is an illustrative plan drawing of a double offset crossed dipoles circuit, an alternative mixer circuit to that shown in FIG. 12.

DESCRIPTION OF PREFERRED EMBODIMENTS

Figure 1:
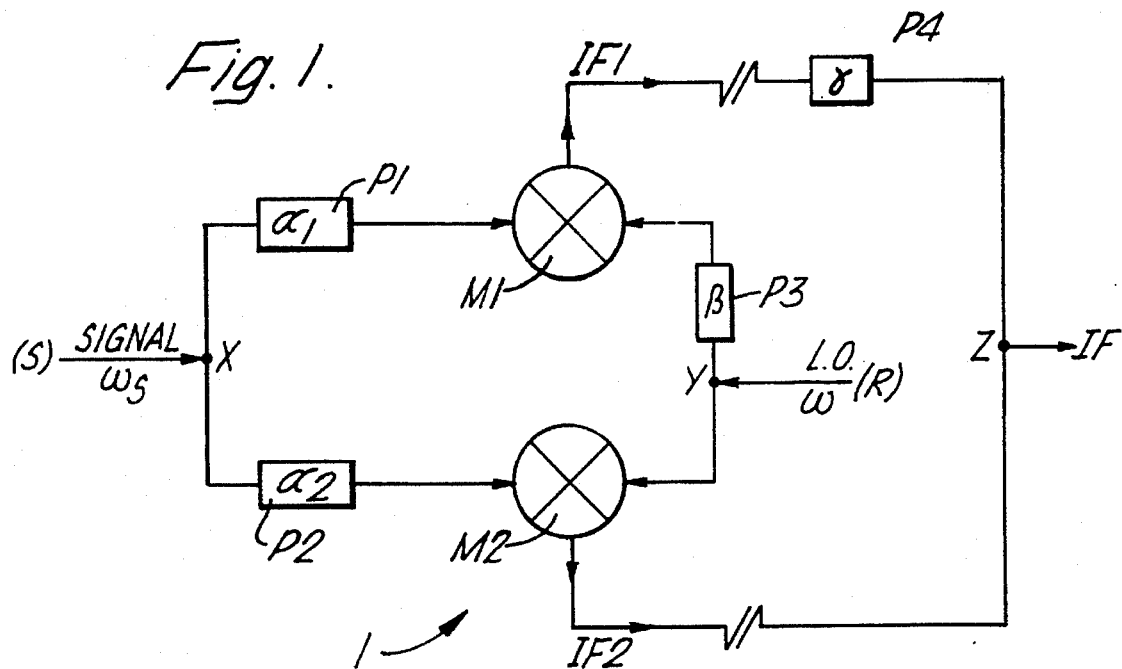
FIG. 1 is a block schematic of a mixer circuit.

Embodiments of the invention will now be described, by way of example only, with reference in particular to the accompanying drawings:

There is shown in FIG. 1 a block schematic of a mixer circuit-1. This circuit 1 is comprised of a pair of mixer elements M1 and M2, each of which is connected in parallel to a signal input X and to a local oscillator reference input Y. Signal power, introduced at the signal input X, is divided between two signal channels and is relayed to the mixer elements M1 and M2 via a phase-shifter interposed in each channel, namely first and second phase shifters P1 and P2, respectively. Reference power, introduced at the reference input Y, is likewise divided between two channels; it is relayed via a third phase shifter P3 to the first mixer element M1, and is relayed directly to the second mixer element M2. Intermodulation products generated by each mixer element, and in particular signals $IF_1$ and $IF_2$ generated at intermediate frequency $(\omega-\omega_s)$ are extracted from the mixer elements, each on a corresponding output channel. The two intermediate frequency signals $IF_1$ and $IF_2$ may be added by internal or external circuitry, and in the embodiments that follow, it is envisaged that any addition is performed externally. As shown in FIG. 1, the intermediate frequency signals $IF_1$ and $IF_2$ are added at a common output Z; the intermediate frequency signal $IF_1$, extracted from the first mixer element M1, being passed first through a fourth phase-shifter P4. The phase shifts introduced by the four phase shifters P1 to P4 are represented in FIG. 1 by algebraic symbols $\alpha_1$, $\alpha_2$, $\beta$ and $\gamma$ respectively.

The properties of this mixer circuit 1 are dependent on the values allotted to each phase shift $\alpha_1$ and $\gamma$. The use of a pair of balanced mixers operated in parallel with an appropriate phase shift introduced in the power feed to one of them allows suppression of image frequency noise; as well as the ability to distinguish between signals $\omega_s$ above and below reference frequency $\omega$. Such a circuit is known as a dual-balanced mixer:

At signal frequency $\omega_s$, for optimum signal-to-noise ratio at output Z, the phase shifts are required to satisfy the following equation $$(\alpha_1-\alpha_2)+\gamma=\beta \qquad \text{Equation (1)}$$

Inevitably, the signal introduced at the input port X will include spurious noise power at image frequency — ie at a frequency of $|2\omega-\omega_s|$. It is desirable that the mixer circuit should be relatively insensitive to input power at this frequency. For optimum image rejection, ie for cancellation at the output port Z, the phase shifts are required to satisfy the following equation $$(\alpha_1-\alpha_2)+\pi-\gamma=\beta \qquad \text{Equation (2)}$$

Thus to achieve both optimised signal-to-noise and image rejection simultaneously, the phase shifts are constrained as follows $$\gamma=\pi/2; \text{ and } (\alpha_2-\alpha_1)+\beta=\pi/2 \qquad \text{Equation (3)}$$

One solution to this last equation, is given by $$\alpha_1=\alpha_2; \beta=\gamma=\pi/2 \qquad \text{Solution (1)}$$

Another solution is given by $$\alpha_1=0; \alpha_2=\beta=\pi/4 \; \gamma=\pi/2 \qquad \text{Solution (2)}$$

The attainment of each of these solutions, using diode coupled planar crossed dipoles, is demonstrated by the embodiments that follow below.

It is noted that each mixer element M1, M2 will generate power at the image frequency $|2\omega-\omega_s|$, and under certain conditions as much signal power can be converted to this as to the intermediate frequency (IF) at $|\omega_s-\omega|$. An improvement in conversion loss of up to 3 dB is possible provided power at image frequency is not radiated but is reactively terminated. The use of a band-stop filter is not practical because the fractional offset from the signal frequency $\omega_s$ is small. The use of appropriate phasing in a dual balanced mixer circuit is a possible solution. Cancellation at input port X, of power generated at image frequency, ensures that no power is relayed to the signal source where it may be radiated. For this, it is required that:

$$\beta=\pi/2 \text{ (any } \alpha_1, \alpha_2) \qquad \text{Equation (4)}$$

This is consistent with solution (1) above.

It is not at the same time possible to achieve cancellation at the reference port Y. Provided, however, that the mixer elements M1 and M2 have good reference to signal RF isolation, cancellation at Y is not requisite and only equation (4) above need be satisfied.

Figure 2:
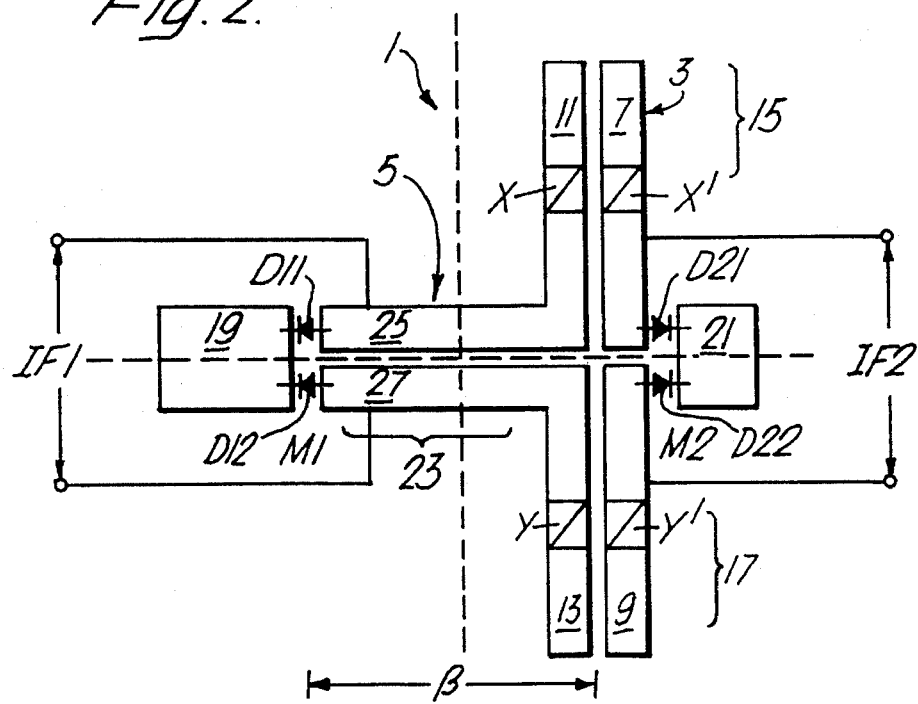
FIG. 2 is an illustrative plan drawing of a planar, diode coupled, crossed dipoles circuit, a dual-balanced implementation of the mixer circuit shown in the preceding figure.

A dual balanced implementation of this mixer circuit 1 is shown in FIG. 2. This dual balanced mixer is comprised of a pair of crossed dipoles 3 and 5; these dipoles 3 and 5 are arranged orthogonally; one dipole 3 is shown as vertical, the other dipole, dipole 5, is shown as horizontal. They are coupled to a vertically polarised radiative local oscillator reference field and to a horizontally polarised radiative signal field respectively. The dipoles 3 and 5 are supported upon the surface of a substrate of high dielectric constant material — either an insulator dielectric, or an insulated high resistivity semiconductor, substrate. In the latter case, where insulating material separates the dipoles from the semiconductor body, the insulator thickness is minimal, sufficient for insulation but not so great as to significantly alter the resonant properties of the dipole antennae. In both these cases, therefore, the resonant length of each dielectric mounted antenna is inversely proportional to a scaling factor $\bar{n}$, and the antenna admittance is directly proportional to this scaling factor $\bar{n}$, this factor $\bar{n}$ being to a good approximation independent of antenna geometry and related to the media dielectric constants by the formula $$\bar{n}=\sqrt{(\epsilon+1)/2}$$

ie the square root average of the dielectric constants of the media, each side of the antennae, one of which is air.

The dipoles 3 and 5 are of planar construction. They are each formed of metal deposited upon the surface of the substrate. This metal has been etched to the particular pattern shown in FIG. 2.

The vertical dipole 3 is in the form of a split dipole and is comprised of four metal strips 7, 9, 11 and 13. One pair of parallel strips 7 and 11 serve as one limb 15 of the dipole 5, and the other pair of parallel strips 9 and 13 form the other limb 17. The spacing between strips 7 and 11, and between strips 9 and 13 is small. The strip portions of each limb 15 and 17 are thus strongly coupled at reference RF frequency and behave at RF as if limb 15 (7 and 11) and limb 17 (9 and 13) were each of continuous metal.

The horizontal dipole 5 is comprised of a first rectangular element 19 at one end, a second rectangular element 21 at the other end; and a split section 23 formed of two parallel strip portions 25 and 27, extending between the end portions 19 and 21. The inner end portions of vertical strips 7 and 9 also serve as part of the horizontal dipole 5. The strip portions 25 and 27 of the split section 23 are also strongly coupled at RF frequency. The metal forming these strip portions 25 and 27 is continuous with the metal forming the vertical strips 11 and 13 respectively. A pair of diodes, diodes D11 and D12, is inserted across the gap between the first end portion 19 of the horizontal dipole 5 and the horizontal strips 25 and 27 respectively. These diodes are in parallel and correspond to the first mixer element M1 shown in FIG. 1. Another pair of diodes, D21 and D22, is inserted across the gap between the other end portion 21 of the horizontal dipole 5 and the vertical strips 7 and 9 respectively. These diodes too are in parallel. They correspond to the second mixer element M2 shown in FIG. 1. The diodes D11 to D22 may be discrete components bonded to the metal — ie the circuit may be a hybrid circuit. However, where the substrate is of semiconductor material, it is convenient to form the diodes as integrated components in the underlying material. This latter integration is most useful for very high frequency operation where component dimensions are very small and not compatible with hybrid implementation.

Signal radiation polarised parallel to the horizontal dipoles 5, and at a frequency at or near the resonance for that dipole produces cophased currents at the two mixer elements M1 and M2 ($\alpha_1=\alpha_2=0$). The split section 23 acts as a two conductor transmission line. It corresponds to the third phase shifter P3 of FIG. 1 and introduces a phase shift $\beta$ to reference power relayed from the vertical dipole 3 to the first mixer element M1. Reference power is also fed to the second mixer element M2, but no phase shift is introduced. Output power at intermediate frequency is generated by mixer element 1 and appears as signal IF1 between the diode inputs 25 and 27. Similarly intermediate frequency signal IF2 is developed between diode inputs 7 and 9.

It is a problem extracting IF signal from the circuit shown in figure 2. Simple metal connection to the dipole metal is prohibited, as this would introduce unacceptable RF loading to the dipoles and inhibit resonance. All connections must present high resistance at RF. Since high resistance would be a source of noise, high resistivity contacts present no practical solution to IF extraction, except where signal levels are exceptionally high (a condition occurring in very few practical applications). It is therefore desirable to include preamplification prior to relaying signal to external circuitry. It is not possible to use common emitter connected transistors near to the IF outputs of the mixer elements M1 and M2, since any common emitter connecting would short out the transmission line mode of the delay line 23. Transistors X, X' and Y, Y' are thus located at points remote from the mixer elements M1 and M2, as shown in FIG. 2, the bases of these transistors X, X', Y, Y' being connected to the vertical metal strips 11, 7, 13 and 9 respectively. Even here, however, one problem remains — that of providing common emitter connection between remote pairs of transistors X and Y, and between X' and Y'. A more convenient arrangement is afforded by providing an IF connection between one pair of diagonally opposite metal sections — e.g., section 25, 11 and section 9. The first intermediate frequency signal IF may then be extracted from one close-spaced pair of transistors Y, Y', whilst the second intermediate frequency signal IF2 may be extracted from the other close-spaced pair of transistors X, X' and short, common emitters, connections can be provided without difficulty.

Various configurations of the aforementioned IF connection are illustrated in FIGS. 3 to 6. In these figures the RF loading produced by the diodes D11 to D22 is represented by resistors, and RF capacitors are shown to indicate that it is only the split horizontal section 23 which is used in its transmission mode.

The connection for IF and dc between the metal areas 25, 11 and 9 is best provided by means of a link of thin metal strip encompassed within the envelope of one or other dipole 3 or 5, since any metallisation which extends beyond the dipole envelope is detrimental to the RF properties.

Figure 3:
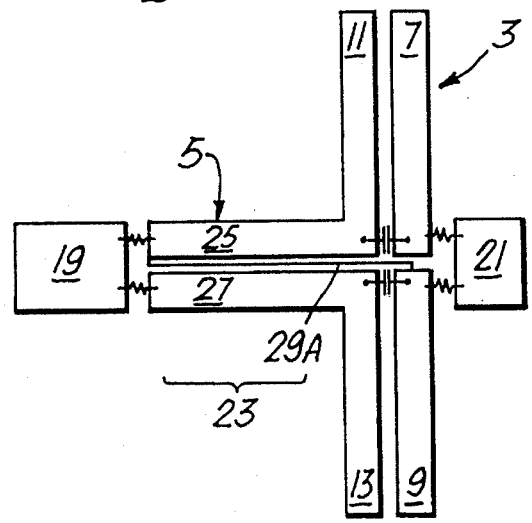
FIGS. 3 to 6 are simplified plan drawings of the dipoles circuit shown in FIG. 2, each distinguished by a different configuration of connective link, a link extending between diagonally opposite portions of the dipole-dipole metallisation.

In the mixer circuit shown in FIG. 3, the connective link is provided by a thin metal strip 29A extending from one end of the horizontal split section 23 to the lower right vertical strip 9. The vertical dipole is unaffected by this extra IF connection 29A and the radiation properties of the horizontal one are also unchanged, but the action of the transmission line section 23 is modified. This section no longer behaves as a two-conductor transmission line, but as a three-conductor transmission line. It is effectively a bandpass filter with a pass band centered on $\theta=\pi/2$ and extending from $\theta_L=\cos^{-1}\{(Z_e-Z_o)/(Z_e+Z_o)\}$ to $\theta_H \pi-\theta$, where $Z_e$ and $Z_o$ are the even and odd mode impedances referred to be center line 29A. This mixer therefore is suitable only for narrowband application. (It is noted that a dual-balanced mixer of the type shown in FIG. 3 has been detailed in a previous patent application — cf U.S. application Ser. No. 357,800).

Figure 4:
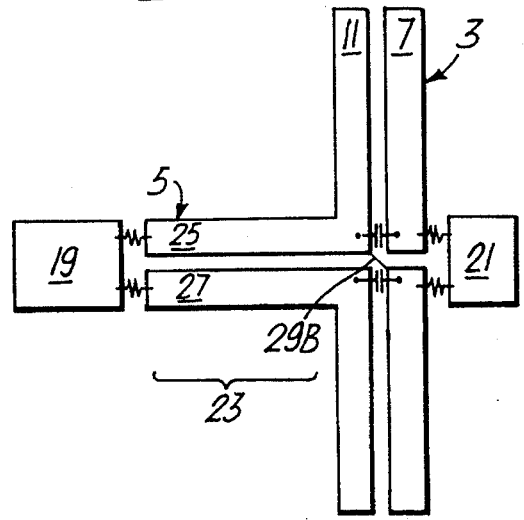
Figure 5:
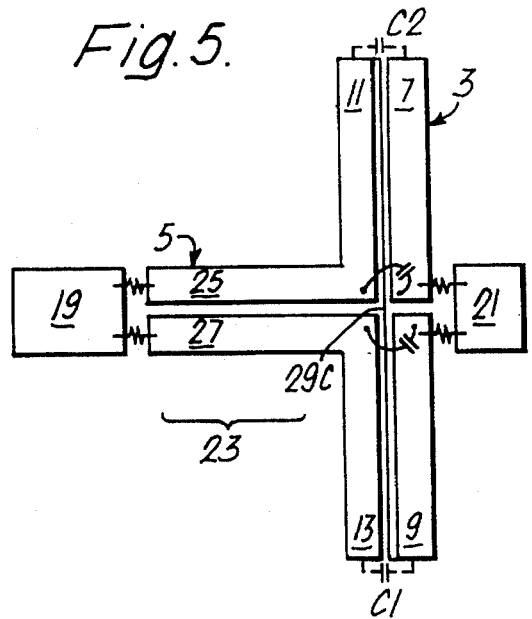
Figure 6:
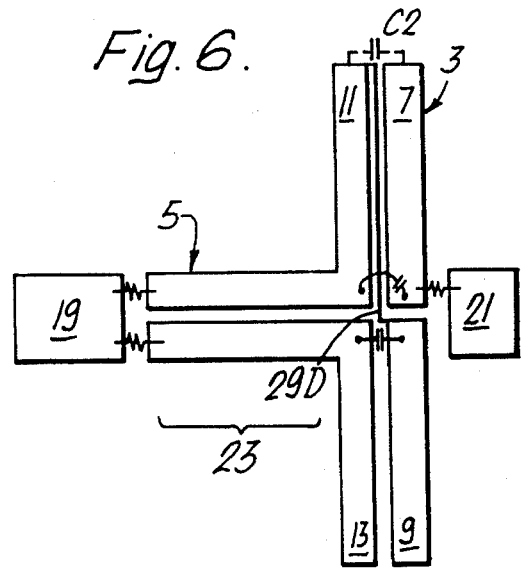

In contrast, in the mixer circuits shown in FIGS. 4 to 6 the RF properties of the vertical dipole are modified while the horizontal dipole 5 remains unaffected. Each of the three configurations shown in these FIGS., 4 to 6, includes an unmodified two-conductor transmission line; they all have the advantage of being suitable for broader band application.

The simplest method of connection, geometrically, is that shown in FIG. 4. The link 29B is short and extends directly across the gap between one corner of common metal 25, 11 and the right-hand vertical strip 9. However, unless this short connective link is so thin that its inductance presents an impedance at RF large compared with the dipole impedance (typically 30 Ω), its effect will be to short a large proportion of the vertically polarised signal. In a hybrid circuit, this connection can be provided by a length of thin bond wire (approximately 0.8 nH/mm; 25 μm diameter), though this construction is of course far from being rugged.

A better arrangement is that shown in FIG. 5. The connective link, 29C in this case, extends the full length of the vertical dipole 3. At its upper extremity it is connected to the left-hand upper vertical strip 11, and at its lower extremity to the right-hand lower vertical strip 9. The principle feature of interest in this circuit is the effect on the impedance of the vertical dipole produced by dividing it up lengthwise. In fact, as is demonstrated below, the modification of impedance proves to be of advantage.

Before considering this configuration at greater length, it is convenient to digress a moment to consider the impedance properties of dielectric mounted dipoles. A simple dipole, a split dipole and two variants of folded dipole are shown in FIGS. 7 to 10. For the purpose of computation it is assumed that each is mounted on a substrate of permittivity (dielectric constant) $\epsilon=12$. The single dipole — FIG. 7 has an impedance at resonance of approximately 30 Ω. The split dipole FIG. 8 has the same dipole dimensions but is split so as to drive, in parallel, a pair of matched loads each of value 2×30 Ω i.e. 60 Ω. This corresponds to the vertical dipole 3 of FIG. 3 when the three-conductor transmission line 23 is attached to its left-hand load point. The first folded dipole — FIG. 5 — is also of the same overall dimensions, but includes a third line 29C of equal width to the outer strip portions 7 to 13. The impedance presented at each break is, for this planar arrangement, a factor four times greater than that of a simple dipole of corresponding dimensions 4×30 Ω=120 Ω. As the center line 29C is replaced by thinner lines, so the impedance is reduced from this value of 120 Ω to the split dipole value of 60 Ω. In FIG. 10, a thin center line variant of this folded dipole, each parallel load impedance is ~98 Ω. The conductor and gap widths, used in this computation, are in the ratio 3:1:1:1:3. The actual width of center line conductor taken may thus be trimmed for optimum matching. It is noted that in both configurations of folded dipole — FIGS. 9 and 10 the center line is connected at each extremity to the conductors each side. In the mixer circuit, this feature is introduced by means of capacitors C1, C2 — as shown in broken outline in FIG. 5. At RF these produce effective short circuit, whilst they remain isolating at IF.

It is noted that in the second mixer M2 the two constituent diodes D21 and D22 are connected in series between the conductor strips 7 and 9 of the vertical dipole 3 (FIG. 2). In contrast to this, these same diodes are connected in parallel across the right-hand gap in the horizontal dipole 5. Ideally, for optimum performance, it is desirable that the load impedance presented by all diodes should be matched to the resonant impedance of each dipole. In the three-conductor transmission line — split dipole construction shown in FIG. 3, only a compromise solution can be afforded. However, in the two-conductor transmission line — folded dipole construction shown in FIG. 5 the impedance of the folded dipole can be trimmed to give a more ideal match. Thus for the circuit shown in FIG. 12 the diodes D11 to D22 are each of impedance 40 Ω. In series they provide a load impedance of 80 Ω each pair, but in parallel they provide a load impedance of 20 Ω each pair. The horizontal dipole 5 is designed to have a resonant impedance of typical value, 40 Ω. The two pairs of parallel diodes D11 and D12, and D21 and D22 thus afford a load of just 20 Ω+20 Ω=40 Ω and thus match the resonant impedance of the horizontal dipole 5. The resonant impedance of the vertical folded dipole 3 is dependent on the spacing and width of the central strip 29, and this can be chosen to give an impedance of 80 Ω at each break. Diodes D21 and D22, each of impedance 40 Ω, are, in series across the break between metal strip portions 7 and 9 of the vertical dipole 3 and thus exactly match this impedance. The transmission line 23 loads the other two metal strip portions 11 and 13 of the vertical dipole. This line 23 is designed to have a characteristic impedance of 80 Ω. It thus introduced the desired impedance 80 Ω across the break between the strips 11 and 13 and is terminated correctly by the impedance 80 Ω of the two series connected diodes D11 and D12 at its other end.

The broad band properties of the folded dipole can be appreciated from an inspection of FIG. 11. The curves depicted on this graph have been computed for two dipoles, the split dipole of FIG. 8 and the folded dipole of FIG. 9. The upper curves show the dependence of the conductance G, the lower curves the susceptance B, as function of frequency. For convenience the frequency scale has been normalised; $f_\pi$ representing the frequency at which the dipole is one half wavelength long. From comparison of these curves it can be seen that the conductance behaviour is very similar. However, for the reactive part — as represented by the lower curves — the variation of susceptance with frequency is very pronounced for the split dipole. In contrast, the susceptance of the folded dipole is very small, near zero, and over a considerable range. This indicates a much larger useful operating bandwidth for the latter case.

From the foregoing it follows that the two conductor transmission line folded dipole configuration shown in FIG. 5 is to be preferred to that shown for the three conductor transmission line split dipole configuration of FIG. 3, for it offers superior bandwidth.

The mixer circuit FIG. 6 is a variant of FIG. 5 in which the connective link 29D is of shorter length. It extends from the upper extremity of the vertical dipole 3 to only halfway down its length. With provision of an RF shorting capacitor C1 across the split at the upper extremity of the vertical dipole 3, the folded dipole thus formed has properties very little different to that of the folded dipole already shown in FIG. 5.

A practical implementation of the preferred mixer circuit is shown in detail in FIGS. 12 to 14. In this practical implementation, the split section two-conductor transmission line 23 has been foreshortened to reduce the offset of the vertical dipole 3 from the center of the horizontal dipole 5. Theoretical calculation of the impedance at the breaks in a doubly split dipole, (such as the horizontal dipole 5 shown) shows that the distance of the breaks from the dipole center should not exceed approximately one eighth of the overall dipole length. For displacements greater than this the effect of the loading due to the transverse dipole is to produce impedances at both breaks which have a high resistive component together with a reactive component which is never small and which results in non-resonant behaviour. This restriction effectively limits to about π/4 the phase shift which can be introduced by the use of an offset dipole feeding a transmission line. However, the introduction of localised capacitative loading (by planar interdigital combine structure — as shown by structure 31 in FIG. 12 — or by dielectric spacer and overlaid, periodically spaced, transverse metal strips) can be used to produce slowing of the transmission line mode of propagation. The radiative mode is unaffected by this measure. In this way, phase shifts larger than π/4, and indeed phase shifts of value π/2, can be achieved without undue distortion of the impedance properties.

As shown in FIG. 13, resistive connections A to L are provided between the antenna metal, the transistors X, X', Y, Y' and contact pads (not shown) arranged about the periphery of the circuit 1. These are arranged in circuit to afford bias voltages necessary for the four mixer diodes D11 to D22, and output terminals for the four transistors. In a hybrid circuit construction, these connections are all formed of resistive ink. The equivalent circuit layout is shown in the circuit diagram of FIG. 14.

An alternative approach to dual-balanced mixer construction is illustrated by the mixer shown in FIG. 15. This mixer likewise is comprised of a pair of crossed orthogonal dipoles, a vertical dipole 3 and a horizontal dipole 5. These are mounted on a substrate of high dielectric constant material. Each dipole 3, 5, however, crosses the other dipole 5, 3 at a point displaced from each dipole center. The vertical dipole 3 is comprised of two pairs of parallel vertical metal strips 7, 11 and 9, 13 and also a rectangular plate 61 at the lower end of the vertical dipole 3. A pair of diodes D21 and D22 is inserted in parallel across the gap between this plate 61 and the lower pair of vertical strips 9 and 13. They correspond to the second mixer element M2 shown in FIG. 1. The horizontal dipole 5 is of similar construction and is comprised of two pairs of parallel horizontal metal strips 25, 27, and 63, 65 and also a rectangular plate 19 at one end of the horizontal dipole 5. A second pair of diodes D11 and D12 are inserted in parallel across the gap between this plate 19 and the left-hand pair of parallel horizontal strips 25 and 27. They correspond to the first mixer element M1 shown in FIG. 1. It is observed that adjacent orthogonal metal strips (7 and 63; 9 and 65'; 11 and 25, and 13 and 27) are connected and as shown in FIG. 9 each connected pair is of L-shape.

In this mixer the left-hand pair of horizontal strips 25 and 27 serves as a two-conductor transmission line 23. This inserts a phase delay β between the local oscillator feed (dipole 3) and the first mixer M1. The transmission line 23 is dimensioned so that the phase delay 8 inserted is of value π/4. The lower pair of vertical strips 9 and 13 likewise serve as a two-conductor transmission line 67 and with appropriate dimensions this line inserts a phase delay $α_2$ of value π/4 between the signal feed (dipole 5) and the second mixer element M2. It is noted that since the first mixer element M1 lies in the horizontal dipole 5 and this is coupled to the signal radiation field of horizontal polarization, no phase-shift is inserted ($α_1=0$). The values of phase shift ($α_1=0$, $α_2=β=π4$) thus correspond to solution (2) discussed in the context of FIG. 1. The circuit therefore gives optimum signal-to-noise and provides rejection of signal noise power at image frequency, provided the intermediate frequency signals IF1 and IF2 extracted from the mixer elements M1 and M2 are summed with a phase delay insertion of π/2 using add-on circuitry.

To facilitate extraction of intermediate frequency signal, a connective link is provided to connect one of the L-shaped metal portions with the portion diagonally opposite. Thus, as shown, the connective link 29D extends between one L-shaped portion 7, 63 and that portion diagonally opposite, portion 13, 27. In a hybrid circuit this link could be provided by a short length of bond wire, similar to that discussed for the previous example. However, in preference to this, the link 29D is provided by a thin metal strip extending the full length of, and in between, the upper vertical strips 7 and 11. One of the intermediate frequency signals, signal IF1, may be extracted across the upper pair of isolated vertical strips 7 and 11. The other intermediate frequency signal, signal IF2, may be extracted across the right-hand pair of isolated horizontal strips 63 and 65. To this end bases of long-tail pair transistors Y, Y' and X, are connected to these strips 11, 7 and 65, 63. Folded dipole construction is completed by the insertion of an RF short, a capacitor, across the ends of the upper vertical strips 7 and 11.

The principle advantage of this circuit is that the delays $α_2$, β each of value π/4 can be implemented without having to introduce any slowing in the transmission modes of the delay lines 23, 67. In this respect this circuit is easier to fabricate than the circuit of the preceding example. However, it is really suited to situations in which low receiver noise is not at a premium. The loading of the two dipoles 3 and 5 is non-symmetrical. This may be overcome by insertion of an IF link 29E in between the right-hand pair of horizontal strips 63 and 65, and by matched loads Z across the free ends of the dipoles 3 and 5, ie between strips 7 and 11 and between strips 63 and 65. These loads, however, absorb 25% of the reference and signal power and result in unequal LO drives to the two mixers M1 and M2.

In the foregoing discussion it has been assumed that the reference and signal are of very similar frequencies, and the difference in frequency is small in comparison. The length of each dipole is chosen to be of resonant length — i.e. approximately one half wavelength long at reference or signal frequency, as appropriate in each case. These lengths are near equal. It is noted that the polarisations of signal and reference can be interchanged with respect to the crossed dipole configuration. Since the signal is usually weak compared to reference, any impedance mismatch should be confined to the reference feed.

Subharmonic variants of the mixer circuits are also possible. The dipole lengths are however significantly different, and are designed to be resonant at very different LO and signal frequencies. In appropriate circumstances, phase delays greater than π/4, and indeed phase delays of π/2, can then be implemented without resort to transmission mode slowing techniques. (See U.S. application Ser. No. 512,438).

I claim:

1. A mixer circuit comprising:

a supportive substrate;

first and second dipoles, each of planar metal and lying upon the substrate, these dipoles intersecting and being arranged orthogonal to one another;

first and second mixer elements, each element being connected across a gap in the dipole metal of the first dipole and of the second dipole respectively, and each being fed by both dipoles;

the first dipole being split along a portion of its length and affording thereby a two conductor transmission delay line extending between the first mixer element and the region of dipole-dipole intersection;

the second dipole being split along a portion of its length and affording thereby a pair of isolated conductors extending between the region of dipole-dipole intersection and an open end of the second dipole; and, a connective link joining one of the line conductors to one of the isolated conductors, this link lying outside of the envelope of the line but within the envelope of the second dipole, this link thus permitting the extraction of intermediate frequency signal (ie signal developed across the first mixer) via the two isolated conductors.

2. A circuit, as claimed in claim 1, wherein the substrate is of dielectric insulator material and the mixer elements are bonded to the circuit.

3. A circuit, as claimed in claim 1, wherein the substrate is of semiconductor material and the mixer elements are formed in the body thereof.

4. A circuit, as claimed in claim 1, wherein the connective link is provided by a thin metal strip, a strip extending along a substantial part of the length of the second dipole, one or both ends of the second dipole being terminated by a capacitor, the second dipole thus modified having the properties of a folded dipole.

5. A circuit, as claimed in claim 1, wherein the two-conductor delay line includes a slowing mechanism.

6. A circuit, as claimed in claim 5, wherein the mechanism is provided by an interdigitated combine structure coupling the two conductors of the delay line.

7. A circuit, as claimed in claim 1, wherein each dipole is crossed at a point displaced from each dipole center, the structure being symmetric, a connective link strip of metal being provided in each dipole and having a common connection at the point of orthogonal intersection of the two dipoles.

* * * * *